US007732987B2

(12) United States Patent
Gao et al.

(10) Patent No.: US 7,732,987 B2

(45) Date of Patent: Jun. 8, 2010

(54) ULTRASONIC TRANSDUCER ARRAY AND A METHOD FOR MAKING A TRANSDUCER ARRAY

(75) Inventors: Peng Gao, Singapore (SG); Ching Biing Yeo, Singapore (SG); Xiaobing Sun, Singapore (SG); Kanzo Okada, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/154,326

(22) Filed: May 22, 2008

(65) Prior Publication Data

US 2008/0290757 A1 Nov. 27, 2008

(30) Foreign Application Priority Data

May 25, 2007 (SG) ............................ 200703601-5

(51) Int. Cl.
*H01L 41/09* (2006.01)

(52) U.S. Cl. ........................ 310/328; 310/334; 310/348

(58) Field of Classification Search ................. 310/328, 310/334, 348
See application file for complete search history.

(56) References Cited

U.S. PATENT DOCUMENTS 6,108,433 A * 8/2000 Norris ........................ 381/399
6,255,761 B1 7/2001 Benjamin
6,490,360 B2 * 12/2002 Corsaro ...................... 381/182
6,775,388 B1 * 8/2004 Pompei ...................... 381/191
2001/0033124 A1 * 10/2001 Norris et al. ............... 310/348
2004/0150871 A1 * 8/2004 Yang .......................... 359/291
2005/0103107 A1 * 5/2005 Morris et al. ................. 73/642
2007/0029899 A1 * 2/2007 Matsuzawa ................. 310/334
2008/0079332 A1 * 4/2008 Rorick ....................... 310/334

FOREIGN PATENT DOCUMENTS

WO WO/99/08479 * 2/1999
WO WO 03/032678 4/2003

* cited by examiner

*Primary Examiner*—Thomas M Dougherty
(74) *Attorney, Agent, or Firm*—Frommer Lawrence & Haug LLP; William S. Frommer; Paul A. Levy

(57) ABSTRACT

A transducer array comprises a conductive back plate 32, a conductive front plate 33 having openings 62, and a plurality of piezoelectric vibrator elements 31 located in an array between the plates. The vibrator elements 31 are two-layer elements which each include a metal portion 311 and a PZT element 312. These elements 311, 312 are in electrical contact with the respective plates. The vibrator elements 31 are attached to support elements 51 upstanding as part of the back plate 32. The transducer array can be formed as a batch process in which the vibrator elements 31 are formed simultaneously, and then simultaneously attached to the support elements 51.

5 Claims, 5 Drawing Sheets

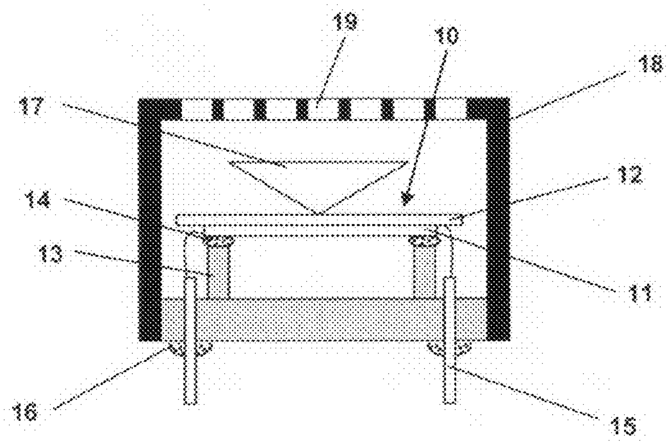
Figure 1 (*prior art*)
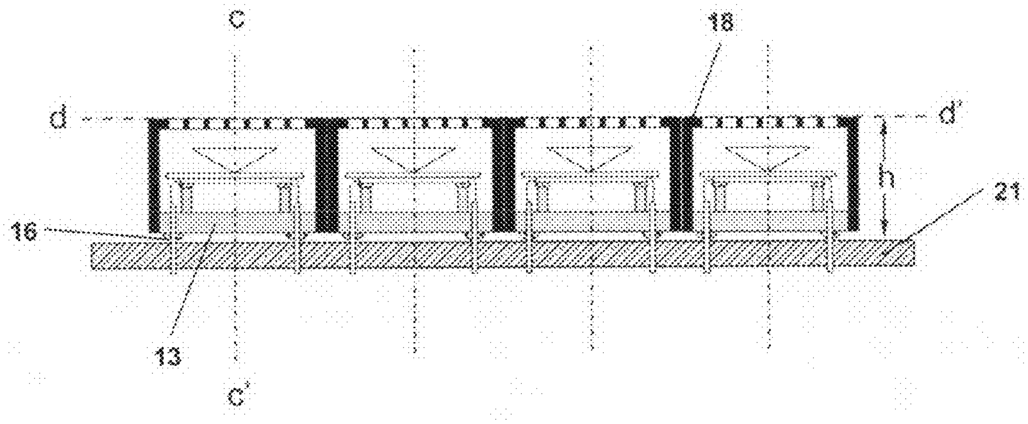
Figure 2 (*prior art*)

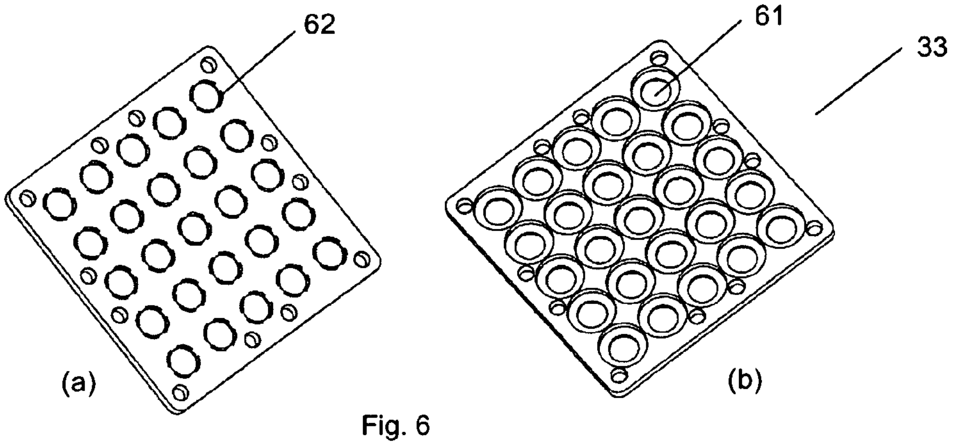
Fig. 6
Fig. 7
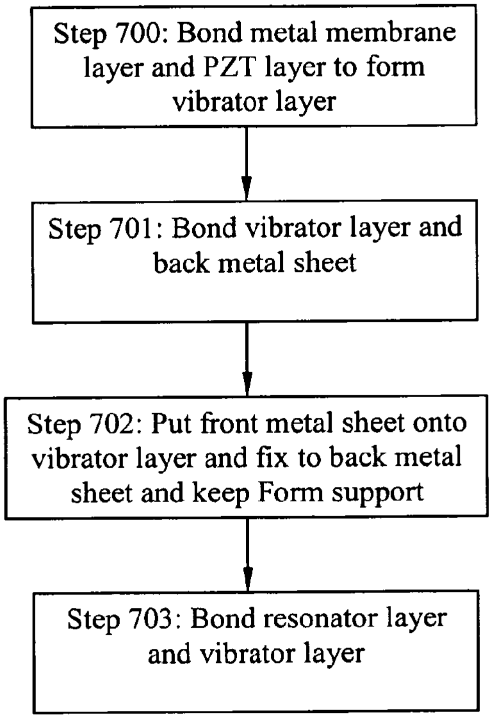

Fig. 8
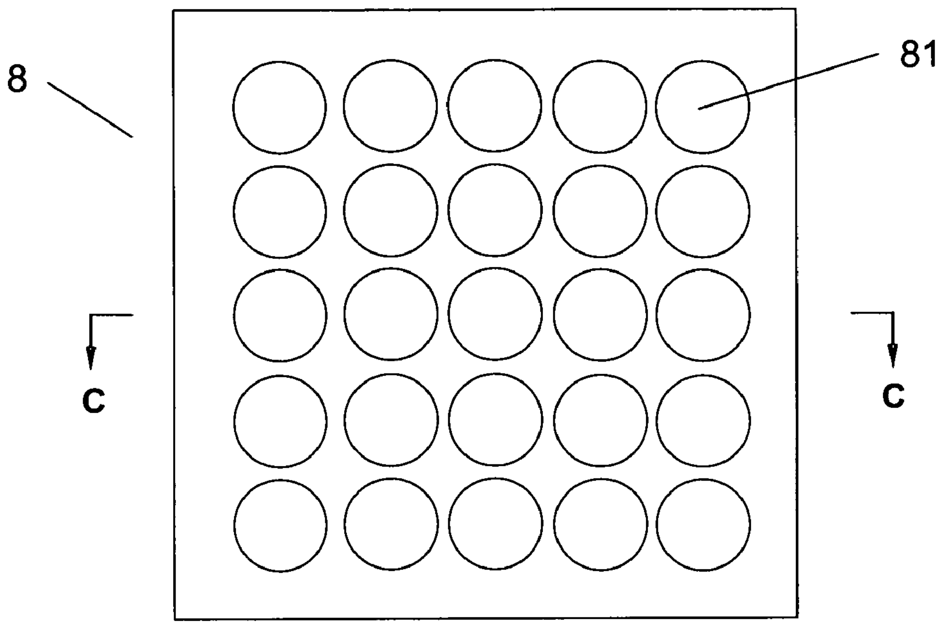
(a)
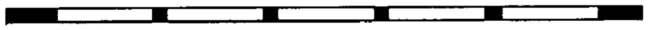
(b)
C-C
view

ULTRASONIC TRANSDUCER ARRAY AND A METHOD FOR MAKING A TRANSDUCER ARRAY

FIELD OF THE INVENTION

The present invention relates to a transducer array suitable for generating sounds in an ultrasonic frequency range (an "Ultrasonic Transducer Array"), and to a method of making it. The transducer array includes transducer elements including piezoelectric material, such as PZT.

BACKGROUND OF THE INVENTION

It is well know in the art to use piezoelectric devices as ultrasonic transducers. For example ceramic-based piezoelectric lead zircomate titanate (PZT) is used in commercially available ultrasonic transducers. FIG. 1 illustrates a typical prior art PZT ultrasonic transducer, including a two-layer transducer element 10 with a poled PZT sheet 11 bonded with a metal sheet 12.

The transducer element 10 is fixed by silicone adhesive 14 on a ceramic support 13 within a case 18. A pair of pins 15 are electrically connected to the PZT layer 11 and are fixed in place though the ceramic support 13 by an adhesive 16. The transducer element 10 is deflected when an external voltage is supplied though the pins 15. This provides larger displacements around the centre of the element.

In order to intensify the transducer-to-air coupling efficiency, a lightweight cone 17 is attached to the centre of the transducer element 10. A number of sound emission holes 19 are provided in the case 18, in front of the cone 17. This device is good for many applications, but its parametric ability and maximum sound pressure level are limited due to its size.

When applied to a parametric audio system, such elements may be used in an array form using many elements for effective parametric conversion. FIG. 2 is an example of an ultrasonic transducer array employing this type of commercial PZT transducer elements for a parametric speaker. Four elements are displayed, all attached to one support frame 21 through pins 15. Electrical wiring is provided so that all the transducers 10 are connected in series, so they all respond equally and concurrently to an applied voltage. Building the ultrasonic transducer array in such a way is straightforward, but unfortunately there exist a few important technical problems.

Firstly, it is difficult to align all the transducer elements. Ideally the central axis (line c-c' in FIG. 2) in each element would be perfectly perpendicular to the support frame 21 and all the elements would be at the same level. However since there are non-uniform adhesion points 16 sandwiched between the transducer's ceramic plate 13 and the support frame 21 this is highly difficult to achieve in practice. As a result, each transducer element has a slightly different phase which limits the overall performance.

Secondly, the case 18 or even the ceramic plate 13 of each transducer occupies substantial space, making it more difficult to provide a thin and compact array aperture for mobile device applications. Furthermore, the case 18 tends to increase the centre-to-centre distance between adjacent transducer elements, which is not conducive to suppressing the side-lobes of the transmitted ultrasonic wave.

Thirdly, placing commercial transducers onto a support frame one by one to form an array, and electrically connecting them one by one, limit manufacturability and decrease both uniformity and repeatability.

SUMMARY OF THE INVENTION

The present invention aims to provide a new and useful ultrasonic transducer array, and a method for making it.

In a first expression of the invention, a PZT ultrasonic transducer array is provided comprising:

(a) a conductive back plate;

(b) a conductive front plate having openings;

(c) a plurality of piezoelectric vibrator elements located in an array between the plates, the vibrator elements each including a piezoelectric element, each vibrator element having two portions in electrical contact with the respective plates.

Thus, since each vibrator is provided with electrical contact to the two plates, the plates may function as the respective terminals of the transducer array, without requiring an additional step, carried out individually for each transducer, of forming electrodes to contact the vibrators.

Each vibrator may be provided as a two-layer vibrator in which one-layer is made of a metal membrane and is bonded to a piezoelectric layer, such as a PZT wafer.

Each vibrator may be bonded at the position of its nodal line onto the back plate.

Conveniently, the back plate may have a series of ring-shaped protrusion supports. The center of each support is aligned along the same axis as that of the corresponding two-layer vibrator. Under the vibrator is a back cavity.

The front sheet may have a series of emission holes and protrusions. It may be attached to the back metal sheet and touch all the vibrators at the position of their nodal lines.

A lightweight cone is attached to the centre of the vibrator as a resonator to intensify the transducer-to-air coupling efficiency. This cone may have a conical or frusto-conical shape. Note that the term "conical" is used here to include also trumpet-like shapes, in which the diameter of the cone does not increase linearly with the axial distance along it; furthermore, it is used to include shapes which do not have circular axial symmetry, such as shapes in which at each axial position the cone is an ellipse.

In a second expression, the invention provides a method for producing a transducer array, the method comprising:

(a) bonding a conductive back plate to a plurality of piezoelectric vibrator elements located in an array, the vibrator elements each including a piezoelectric element, the piezoelectric elements having a first portion in electrical contact with the back plate;

(b) attaching a conductive front plate to the conductive back plate, each vibrator element having a second portion in electrical contact with the conductive front plate.

Note that the first of these steps may be performed as a single step, in which the vibrator elements are attached to the back plate substantially simultaneously. Thus, the fabrication process can more easily be carried out as a batch process. This has the advantages of making possible a low manufacturing cost and high performance, since the manufacturing tolerances of the individual transducers are reduced.

BRIEF DESCRIPTION OF THE DRAWINGS

Embodiments of the invention will now be described, for the sake of example only, with reference to the accompanying drawings in which:

FIG. 1 shows a prior art commercial PZT ultrasonic transducer element.

FIG. 2 shows a prior art array structure employing the commercial PZT ultrasonic transducer elements of FIG. 1.

FIG. 3(*b*) and FIG. 3(*c*), is an illustration of an ultrasonic transducer array which is an embodiment of the present invention, illustrated in plan view (FIG. 3(*a*)), perspective view (FIG. 3(*b*)), and cross-sectional view (FIG. 3(*c*)).

FIG. 6, which is composed of FIGS. 6(*a*) and 6(*b*), is an illustration of a front metal sheet of the embodiment of FIG. 3.

FIG. 7 is a flow-chart of the steps of a batch process for making the embodiment of FIG. 3.

FIG. 8, which is composed of FIGS. 8(*a*) and 8(*b*), is an illustration of an aligning mask used in the process of FIG. 7.

DETAILED DESCRIPTION OF THE EMBODIMENTS

Figure 3:
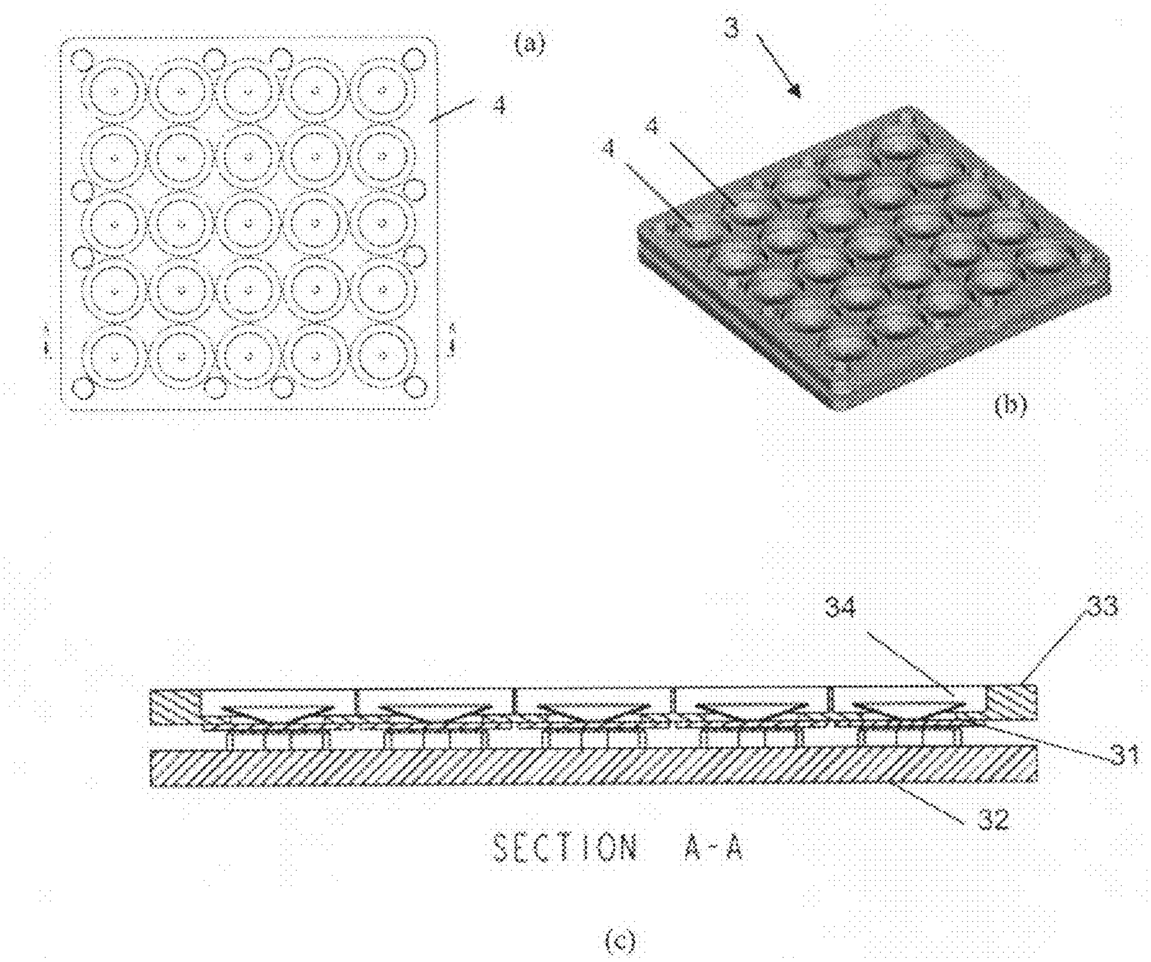
FIG. 3, which is composed of FIG. 3(*a*).

FIG. 3 shows a PZT ultrasonic transducer array 3 which is an embodiment of the present invention. It is shown in a plan view in FIG. 3(*a*) and in a perspective view in FIG. 3(*b*). FIG. 3(*c*) is a cross-sectional view, in the plane shown by the line A-A of FIG. 3(*a*). The array 3 comprises a 5×5 array of transducer elements 4 (in other embodiments other types of array are possible).

Figure 4:
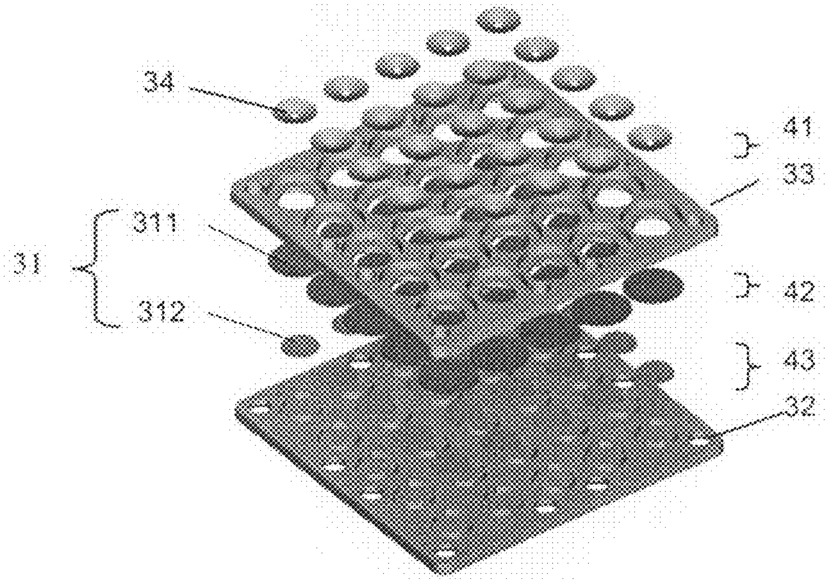
FIG. 4 is an exploded view of the embodiment of FIG. 3.

Each element 4 includes a two-layer vibrator unit 31, and a resonator 34 in the form of a lightweight cone. The structure of the vibrator unit 31 is shown in FIG. 4. The vibrator unit 31 includes one planar circular layer which is a metal membrane 311, and another planar circular layer which is a PZT wafer 312. The set of 25 resonators 34 (each of which is part of a respective one of the 25 transducers) can collectively be considered as a layer 41. Similarly, the set of 25 metal membranes 311 collectively form a non-contiguous layer 42, and the set of 25 PZT wafers 312 collectively form a non-contiguous layer 43.

Figure 5:
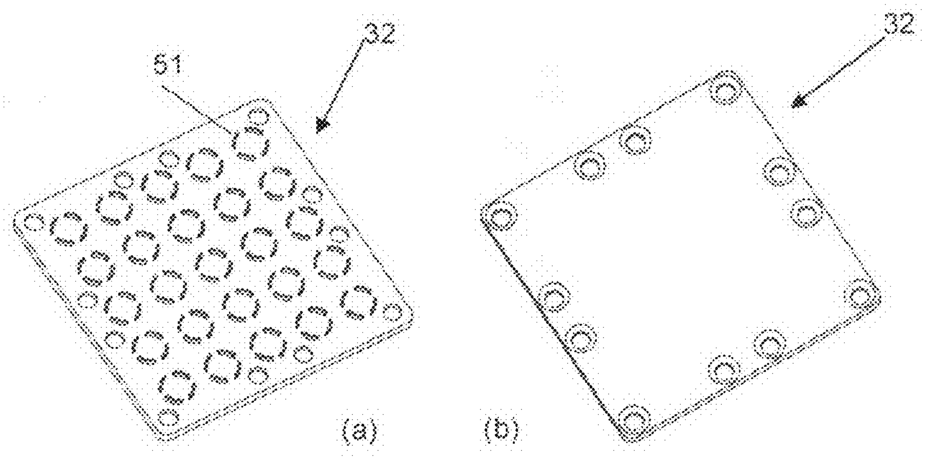
FIG. 5, which is composed of FIGS. 5(*a*) and 5(*b*), illustrates a back metal sheet of the embodiment of FIG. 3.

The array further includes a back metal sheet 32 which includes a series of ring-shaped protrusion supports 51, as shown in FIG. 5. FIG. 5(*a*) shows the back metal sheet 32 looking in a direction which is the down direction in FIG. 3(*c*), while FIG. 5(*b*) shows the back metal sheet 32 looking in a direction which is the up direction in FIG. 3(*c*). In the vertical direction of FIG. 3(*c*), the center of the ring of each support 51 is aligned with the centre of the corresponding two-layer vibrator 31 and the centre of the corresponding resonator 34. Under the vibrator 31 is a back cavity. Preferably, the cavity is less than 1 mm tall.

The diameter of each support 51 is substantially the same size as that of a circular nodal line of the vibrator 31. Each vibrator 31 is fixed onto the back metal sheet 32 by conductive epoxy (not shown) at the position of its nodal line. This bonds the circular upper edge of the support 51 to the lower surface of the vibrator 31. The position of the nodal line in the vibrator may be determined by numerical simulation or experiment. The vibrator 31 typically extends radially outwardly from the support 51.

The array further includes a front metal sheet 33 having a series of emission holes 61 and protrusions 62, as shown in FIG. 6. FIG. 6(*a*) shows the back metal sheet 33 looking in a direction which is the up direction in FIG. 3(*c*), while FIG. 6(*b*) shows the back metal sheet 32 looking in a direction which is the down direction in FIG. 3(*c*). The front metal sheet touches all the vibrators 31 at their nodal lines.

The PZT has two surface electrodes. One of them is the back metal sheet 32 which is bonded to one electrode surface of all PZT wafers 41, so that the back metal sheet also functions as one electrode terminal. The front metal sheet 33, which touches all the vibrators 31 at their nodal lines, functions as the other electrode terminal. This arrangement leads to two advantages: (i) it means that the task of connecting electrodes to the transducers is simplified, and in particular it can be done as a batch-process as discussed below, and (ii) the two sheets 32, 33 (which may be of metal, e.g. Al) provide heat dissipation when the transducer has been in operation for a long time. In the structure explained above, no cover case is provided to each transducer element and all the two-layer vibrators 31 rest on a single substrate 32, resulting in a compact and thin transducer array structure.

The fabrication process of the embodiment employs a multi-layer bonding method, to replace the conventional process in which the elements of the transducers are assembled one-by-one. This gives the present embodiment the advantages of: (i) reducing the assembly tolerance to achieve a uniform structure, and (ii) providing a cost-effective process suitable for batch fabrication. The fabrication process is as follows:

1. forming the plurality of resonator elements 34,
2. forming a front metal sheet 33 including a plurality of sound emission holes 61 and protrusions 62, and a back metal sheet 32 including a plurality of supports 51, and
3. forming the PZT ultrasonic transducer array by multi-layer bonding.

Step 3 is composed of the steps 700 to 703 shown in FIG. 7.

In step 700, the 25 round metal elements 311 are aligned by placing them in respective through-holes 81 in a first mask 8 shown in FIG. 8. FIG. 8(*a*) shows the first mask in plan view, and FIG. 8(*b*) shows it in cross-section in the plane shown as C-C in FIG. 8(*a*). At this time the first mask 8 is supported by a first support mechanism (not shown). Then, the 25 PZT elements 312 are located in the through holes of a second mark having the same configuration as the first mask 8, and supported by a second support mechanism. Thus, the 25 elements 311 together form a layer 42 (co-planar with the first mask 8), while the 25 elements 312 together form a layer 43 (co-planar with the second mask). The two support mechanisms are positioned so that the central axis of each membrane element 311 is aligned with the axis of a corresponding PZT element 312. After that, the two support mechanisms are moved towards each other until they are in contact tightly. The membrane elements 311 are then adhered to the respective PZT elements 312, thereby forming a vibrator layer having a plurality of vibrator elements 31.

In step 701, the masks are moved to bring the vibrator elements 31 into contact with the circular surface of the support elements 51. The vibrator elements 31 are adhered to the respective support elements 51. The masks are then removed.

In step 702, the front metal sheet 33 is aligned with the vibrator layer, and fixed to the back metal sheet 32 by screws. A pre-load produced by the screws ensures that all the vibrators 31 electrically contact the front metal sheet 33 well.

In step 703, an array of lightweight resonators 34 is attached to the vibrator transducer array (e.g. using a mask with apertures supporting the respective resonators 34?). Each resonator 34 is bonded onto the corresponding vibrator 31 at the centre.

Although only a single embodiment of the invention has been described in detail, many variations are possible within the scope of the invention as defined in the claims.

The invention claimed is:

1. A transducer array comprising:

(a) a conductive back plate;

(b) a conductive front plate having openings;

(c) a plurality of piezoelectric vibrator elements located in an array between the plates, the vibrator elements each including a piezoelectric element and a conductive element, wherein each piezoelectric element is in electrical contact with the conductive back plate and each conductive element is in electrical contact with the conductive front plate.

2. A transducer array according to claim 1 in which the back plate comprises outstanding support elements, the vibrator elements being joined to corresponding ones of the support elements.

3. A transducer array according to claim 1 in which the back plate is connected to the vibrator elements at nodal positions on the vibrator elements.

4. A transducer array according to claim 1 in which the vibrator elements are pressed against the front plate.

5. A transducer array according to claim 1 further comprising resonator elements for each transducer, the resonator elements being conical or frusto-conical bodies having an open end directed away from the back plate.

* * * * *